(12) United States Patent
Konishi et al.

(10) Patent No.: US 11,736,127 B2
(45) Date of Patent: Aug. 22, 2023

(54) OPTICAL TRANSMISSION DEVICE AND LIKELIHOOD GENERATION CIRCUIT

(71) Applicant: MITSUBISHI ELECTRIC CORPORATION, Tokyo (JP)

(72) Inventors: Yoshiaki Konishi, Tokyo (JP); Kenji Ishii, Tokyo (JP); Hideo Yoshida, Tokyo (JP); Takashi Sugihara, Tokyo (JP); Tsuyoshi Yoshida, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 92 days.

(21) Appl. No.: 17/405,461

(22) Filed: Aug. 18, 2021

(65) Prior Publication Data
US 2021/0384921 A1  Dec. 9, 2021

Related U.S. Application Data

(63) Continuation of application No. PCT/JP2019/009621, filed on Mar. 11, 2019.

(51) Int. Cl.
*H03M 13/45* (2006.01)
*H04B 10/61* (2013.01)
*H04L 27/38* (2006.01)

(52) U.S. Cl.
CPC ........ *H03M 13/45* (2013.01); *H04B 10/6165* (2013.01); *H04L 27/38* (2013.01)

(58) Field of Classification Search
CPC .............. H03M 13/45; H03M 13/1111; H03M 13/255; H04B 10/6165; H04B 10/541;
(Continued)

(56) References Cited

U.S. PATENT DOCUMENTS

2007/0104294 A1* 5/2007 Kim ...................... H04L 27/183
                                                                  375/332
2016/0344580 A1* 11/2016 Konishi .............. H04L 27/3444

FOREIGN PATENT DOCUMENTS

JP   2007-135193 A     5/2007
WO   WO 2008/038749 A1  4/2008
WO   WO 2015/137049 A1  9/2015

OTHER PUBLICATIONS

Notice of Reasons for Refusal for Japanese Application No. 2019-541813, dated Aug. 29, 2019.

* cited by examiner

*Primary Examiner* — Thien Nguyen
(74) *Attorney, Agent, or Firm* — Birch, Stewart, Kolasch & Birch, LLP

(57) ABSTRACT

Provided is an optical transmission device including: a symbol demapping unit; a likelihood generation circuit configured to generate likelihoods relating to the reception signal; and an error correction decoding unit configured to execute soft decision decoding. The likelihood generation circuit includes: a first one-dimensional-modulation lookup table configured to input the signal of the I-axis component as an argument to output a first likelihood; a second one-dimensional-modulation lookup table configured to input the signal of the Q-axis component as an argument to output a second likelihood; and a two-dimensional-modulation lookup table configured to input, as an argument, the signal being the concatenation of the signal of the I-axis component and the signal of the Q-axis component, to generate a third likelihood. The error correction decoding unit is configured to execute the soft decision decoding based on the first likelihood, the second likelihood, and the third likelihood.

2 Claims, 13 Drawing Sheets

(58) Field of Classification Search
CPC ....... H04B 10/612; H04L 27/38; H04L 27/18; H04L 27/34; H04L 1/0041; H04L 1/0045; H04L 1/0058; H04L 1/0066; H04L 25/067

See application file for complete search history.

BIT b1 LIKELIHOOD VALUE

BIT b1 LIKELIHOOD VALUE

BIT b2 LIKELIHOOD VALUE

BIT b3 LIKELIHOOD VALUE

BIT b4 LIKELIHOOD VALUE

BIT b5 LIKELIHOOD VALUE

BIT b6 LIKELIHOOD VALUE

BIT b0 LIKELIHOOD VALUE

BIT b1 LIKELIHOOD VALUE

BIT b2 LIKELIHOOD VALUE

BIT b3 LIKELIHOOD VALUE

BIT b4 LIKELIHOOD VALUE

BIT b5 LIKELIHOOD VALUE

OPTICAL TRANSMISSION DEVICE AND LIKELIHOOD GENERATION CIRCUIT

CROSS REFERENCE TO RELATED APPLICATIONS

This application is a Continuation of PCT International Application No. PCT/JP2019/009621 filed on Mar. 11, 2019, which is hereby expressly incorporated by reference into the present application.

TECHNICAL FIELD

The present invention relates to an optical transmission device configured to execute soft decision decoding, and a likelihood generation circuit to be used for an optical transmission device.

BACKGROUND ART

In recent years, in modulation methods applied to optical transmission systems, an increase in order of modulation has been in progress as a bit rate of transmission data increases. Further, as a result of achievement of large-scale digital circuits due to miniaturization in a semiconductor manufacturing process and appearance of ultra-high-speed analog digital converters (ADCs) and digital analog converters (DACs) having a sampling speed of some tens of giga samples per second (Gsps), complicated optical signals can be generated and demodulated.

Consequently, there have been developed high-order modulation methods having extremely high orders which was not achieved by related-art optical communication, such as 64-quadrature amplitude modulation (QAM), 128-QAM, and 256-QAM.

In those high-order modulation methods, arrangement intervals between signal points are narrow on a phase plane, and a high signal noise ratio (SNR) is thus required in order to achieve a required transmission distance and a required signal speed. In order to compensate for a deficiency of the SNR, there has further been increasing importance of efficient error correction codes capable of providing a high speed and a high coding gain, for example, low density parity check (LDPC). Thus, the LDPC is used in combination with another error correction code.

For the error correction codes, hard decision decoding and soft decision decoding are executed. The hard decision decoding decides 1 or 0 through use of only a received information sequence. Meanwhile, as a method of enhancing performance, the soft decision decoding uses also analog information on the signal. In the soft decision decoding, the error correction is executed by calculating a likelihood indicating a probability of bits assigned to a signal point from coordinates of the reception signal on the phase plane.

In the calculation of the likelihood in the soft decision decoding, arithmetic calculation processing imposing high load is required to be performed on quantized multi-bit information, and a circuit scale increases accordingly in implementation. To cope with this problem, in place of this high-load arithmetic calculation processing, there are used methods for reducing the circuit scale through use of, for example, approximation of a calculation equation to be used for the likelihood calculation and a lookup table (LUT) that stores likelihoods calculated in advance and inputs the coordinates to output a value (for example, see Patent Literature 1).

In the method described in Patent Literature 1, bits that are on the in-phase (I) axis and the quadrature-phase (Q) axis of the phase plane and are obtained from a reception signal point through use of the hard decision decoding are used to detect a quadrature of the phase plane in which the coordinates of the reception signal point exist. After that, in the method described in Patent Literature 1, based on the information on the quadrature, likelihood information obtained as primary information is converted to final likelihood information. As described above, in Patent Literature 1, there is described the method of limiting a scope within which the value of the likelihood varies depending on the position of the reception signal point to only a range between adjacent signal points including a hard-decision threshold value to reduce the scale of the likelihood generation circuit, thereby downsizing the likelihood generation circuit.

CITATION LIST

Patent Literature

[PTL 1] WO 2008/038749 A1

SUMMARY OF INVENTION

Technical Problem

However, the related art has the following problem.

Due to the advent of a digital coherent technology, an increase in capacity exceeding 1 Tbps of a transmission capacity per one channel unit is in progress in the optical communication system. As a result, the circuit scale of a digital circuit for executing signal processing is approaching a limit of integration of large scale integration (LSI) circuits.

Moreover, meanwhile, as the scope of application of the optical communication system extends to a data center and the like, it is required to use the same LSI to transmit and receive signals modulated by various methods ranging from the quadrature phase shift keying (QPSK) to the 128-QAM.

An LUT to be used to execute the likelihood generation is implemented as a circuit in which the coordinates of the reception signal are used as an input address of a random access memory (RAM) and a likelihood corresponding to the coordinates is stored as data of the RAM to be output. Even in the circuit reduction method of the type using the LUT, when LUTs are individually prepared for various modulation methods, there occurs such a problem that the circuit scale becomes enormous particularly for an extremely high-order modulation method.

The present invention has been made to solve the above-mentioned problem, and has an object to provide an optical transmission device and a likelihood generation circuit which are capable of suppressing an increase in circuit scale at a time when LUTs are used to generate a likelihood.

Solution to Problem

According to one embodiment of the present invention, there is provided an optical transmission device including: a symbol demapping unit configured to convert a reception signal to a signal of an I-axis component and a signal of a Q-axis component on a phase plane, and a signal being a concatenation of the signal of the I-axis component and the signal of the Q-axis component; a likelihood generation circuit configured to generate likelihoods relating to the reception signal based on the signal of the I-axis component and the signal of the Q-axis component converted by the symbol demapping unit and on the signal being the concatenation of the signal of the I-axis component and the signal of the Q-axis component; and an error correction decoding unit configured to execute soft decision decoding on the reception signal based on the likelihoods generated by the likelihood generation circuit, wherein the likelihood generation circuit includes: a first one-dimensional-modulation lookup table configured to input the signal of the I-axis component as an argument to output a first likelihood; a second one-dimensional-modulation lookup table configured to input the signal of the Q-axis component as an argument to output a second likelihood; and a two-dimensional-modulation lookup table configured to input, as an argument, the signal being the concatenation of the signal of the I-axis component and the signal of the Q-axis component, to generate a third likelihood, and wherein the error correction decoding unit is configured to execute the soft decision decoding based on the first likelihood, the second likelihood, and the third likelihood.

According to one embodiment of the present invention, there is provided a likelihood generation circuit including: a first one-dimensional-modulation lookup table configured to input, as an argument, a signal of an I-axis component out of signals obtained by converting a reception signal to the signals on a phase plane, to output a first likelihood; a second one-dimensional-modulation lookup table configured to input, as an argument, a signal of a q-axis component out of the signals obtained by converting the reception signal to the signals on the phase plane, to output a second likelihood; and a two-dimensional-modulation lookup table configured to input, as an argument, a signal being a concatenation of the signal of the I-axis component and the signal of the Q-axis component, to generate a third likelihood, the signal of the I-axis component and the signal of the Q-axis component being the signals obtained by converting the reception signal to the signals on the phase plane.

Advantageous Effects of Invention

According to the present invention, it is possible to provide the optical transmission device and the likelihood generation circuit which are capable of suppressing an increase in circuit scale at the time when LUTs are used to generate the likelihood.

DESCRIPTION OF EMBODIMENTS

Now, with reference to the drawings, an optical transmission device and a likelihood generation circuit according to a preferred embodiment of the present invention are described.

First Embodiment

Figure 1:
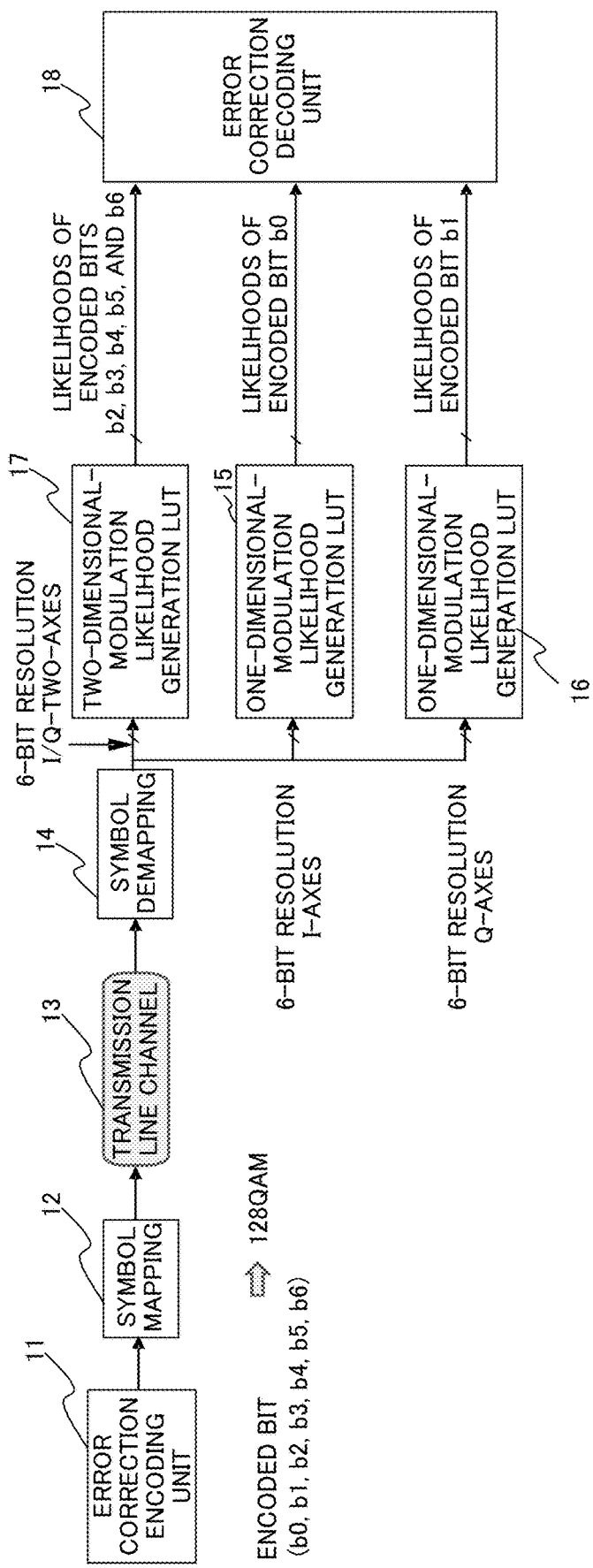
FIG. 1 is a configuration diagram of a 128-QAM likelihood generation circuit according to a first embodiment of the present invention.

FIG. 1 is a configuration diagram of a 128-QAM likelihood generation circuit according to a first embodiment of the present invention. A symbol mapping unit 12 determines coordinates on a phase plane in accordance with encoded bits output from an error correction encoding unit 11, and transmits a mapped signal.

In a symbol demapping unit 14, the signal transmitted through a transmission line channel 13 is converted to a signal of an I-axis component having a 6-bit resolution, a signal of a Q-axis component having the 6-bit resolution, and a signal being a concatenation of the I-axis component and the Q-axis component each having the 6-bit resolution. The signal of the I-axis component and the signal of the Q-axis component are obtained from coordinates of a reception signal point.

After that, the signal of the I-axis component having the 6-bit resolution is input to a one-dimensional-modulation likelihood generation LUT 15. Moreover, the signal of the Q-axis component having the 6-bit resolution is input to a one-dimensional-modulation likelihood generation LUT 16. Further, the signal being the concatenation of the I-axis component and the Q-axis component each having the 6-bit resolution is input to a two-dimensional-modulation likelihood generation LUT 17.

The one-dimensional-modulation likelihood generation LUT 15 inputs the signal of the I-axis component as an argument to generate a likelihood of an encoded bit 0 (b0). The one-dimensional-modulation likelihood generation LUT 16 inputs the signal of the Q-axis component as an argument to generate a likelihood of an encoded bit 1 (b0). Further, the two-dimensional-modulation likelihood generation LUT 17 inputs the signal being the concatenation of the I-axis component and the Q-axis component as an argument to generate likelihoods of an encoded bit 2 (b2) to an encoded bit 6 (b6).

That is, the one-dimensional-modulation likelihood generation LUT 15 corresponds to a one-dimensional-modulation lookup table to be used to generate a first likelihood. Further, the one-dimensional-modulation likelihood generation LUT 16 corresponds to a one-dimensional-modulation lookup table to be used to generate a second likelihood. Further, the two-dimensional-modulation likelihood generation LUT 17 corresponds to a two-dimensional-modulation lookup table to be used to generate a third likelihood.

Moreover, the three lookup tables of the one-dimensional-modulation likelihood generation LUT 15, the one-dimensional-modulation likelihood generation LUT 16, and the two-dimensional-modulation likelihood generation LUT 17 which are configured to generate the likelihoods based on the signals converted by the symbol demapping unit 14 correspond to a likelihood generation circuit.

After that, an error correction decoding unit 18 executes soft decision decoding based on the likelihood values generated by the likelihood generation circuit including the three lookup tables.

Figure 2:
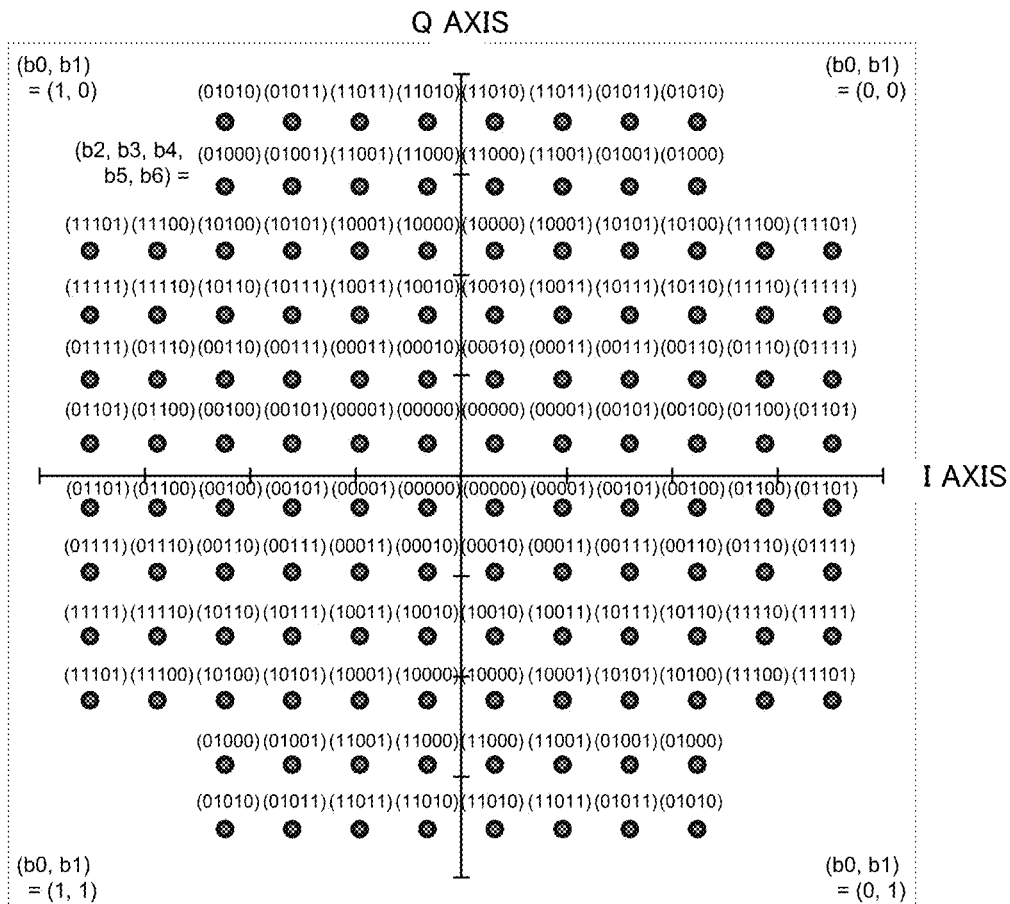
FIG. 2 is an example of a constellation diagram for illustrating a relationship between signal points of 128-QAM and assigned bits in the first embodiment of the present invention.

FIG. 2 is an example of a constellation diagram for illustrating a relationship between signal points of the 128-QAM and assigned bits in the first embodiment of the present invention. As illustrated in FIG. 2, the signal points of the 128-QAM form a non-rectangular constellation in which the signal points are not arranged as a square on the phase plane.

Figure 3:
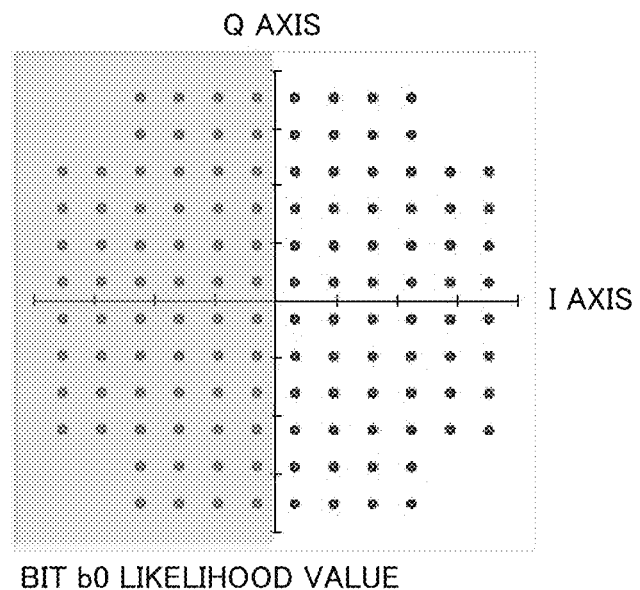
FIG. 3 is a diagram for illustrating a likelihood value in accordance with coordinates of a reception signal point for an encoded bit 0 (b0) of the 128-QAM in the first embodiment of the present invention.
Figure 4:
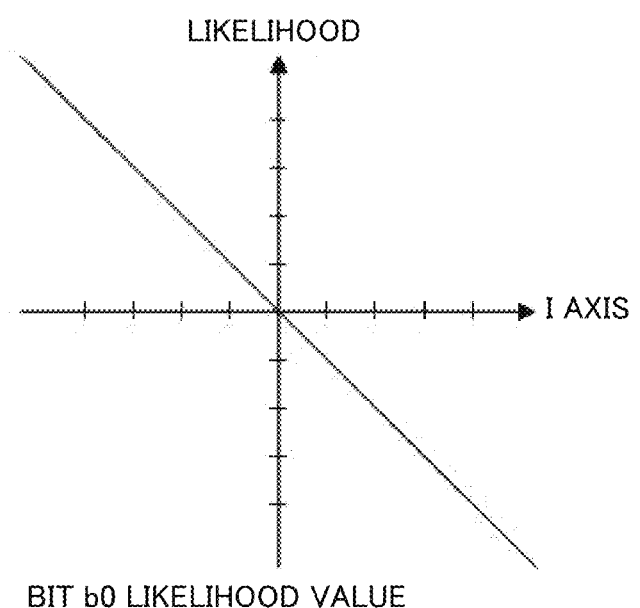
FIG. 4 is a diagram for illustrating a relationship between an I axis direction and the likelihood value of the signal point of the encoded bit 0 (b0) of the 128-QAM in the first embodiment of the present invention.

FIG. 3 is a diagram for illustrating a likelihood value in accordance with the coordinates of the reception signal point for the encoded bit 0 (b0) of the 128-QAM in the first embodiment of the present invention. FIG. 4 is a diagram for illustrating a relationship between the I axis direction and the likelihood value of the signal point of the encoded bit 0 (b0) of the 128-QAM in the first embodiment of the present invention. A hatched portion of the constellation corresponds to a region in which the likelihood value is positive. The encoded bit 0 (b0) is assigned to only the I axis direction of the signal point, and can thus be processed by a one-dimensional modulation LUT that generates the likelihood based on only coordinate information on one axis. The likelihood value indicating that the encoded bit is 1 or 0 increases as the absolute value of the coordinate of the reception signal on the I axis increases.

Figure 5:
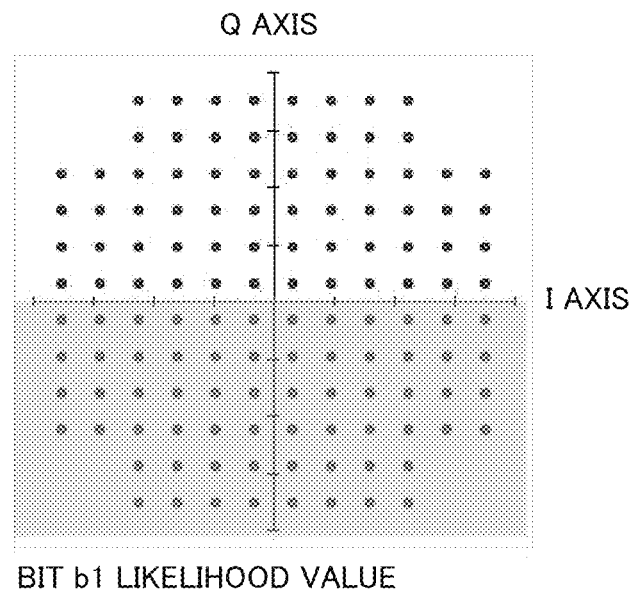
FIG. 5 is a diagram for illustrating a likelihood value in accordance with the coordinates of the reception signal point for an encoded bit 1 (b1) of the 128-QAM in the first embodiment of the present invention.
Figure 6:
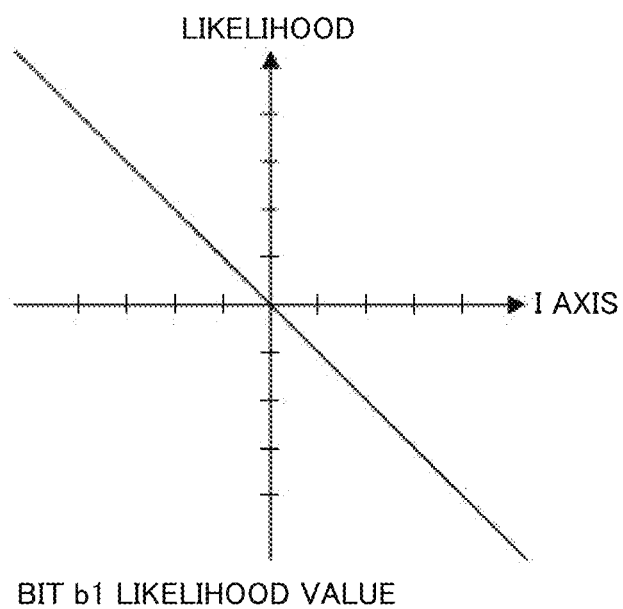
FIG. 6 is a diagram for illustrating a relationship between a Q axis direction and the likelihood of the signal point for the encoded bit 1 (b1) of the 128-QAM in the first embodiment of the present invention.

FIG. 5 is a diagram for illustrating a likelihood value in accordance with the coordinates of the reception signal point for the encoded bit 1 (b1) of the 128-QAM in the first embodiment of the present invention. FIG. 6 is a diagram for illustrating a relationship between the Q axis direction and the likelihood value of the signal point of the encoded bit 1 (b1) of the 128-QAM in the first embodiment of the present invention. A hatched portion of the constellation corresponds to a region in which the likelihood value is positive.

The encoded bit 1 (b1) is assigned to only the Q axis direction of the signal point, and thus, as in a case of the encoded bit 0, can be processed by a one-dimensional modulation LUT that generates the likelihood based on only coordinate information on one axis. The likelihood value indicating that the encoded bit is 1 or 0 increases as the absolute value of the coordinate of the reception signal on the Q axis increases.

Figure 7:
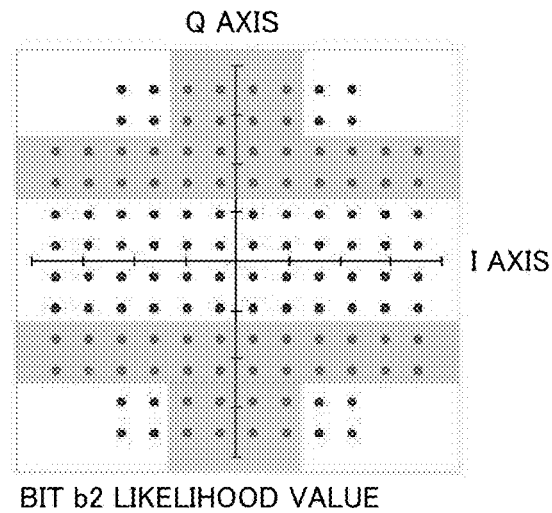
FIG. 7 is a diagram for illustrating a likelihood value in accordance with the coordinates of the reception signal point for an encoded bit 2 (b2) of the 128-QAM in the first embodiment of the present invention.
Figure 8:
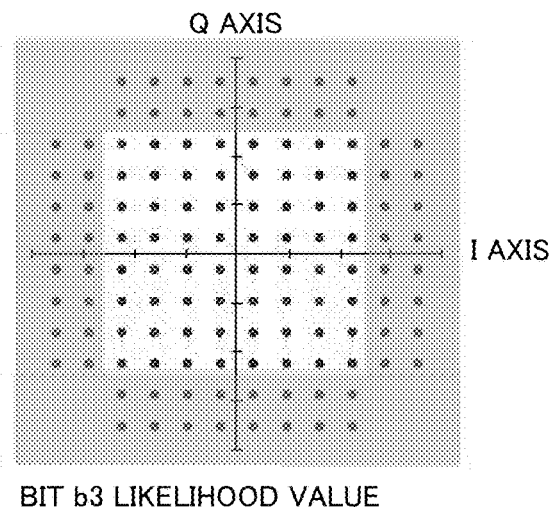
FIG. 8 is a diagram for illustrating a likelihood value in accordance with the coordinates of the reception signal point for an encoded bit 3 (b3) of the 128-QAM in the first embodiment of the present invention.
Figure 9:
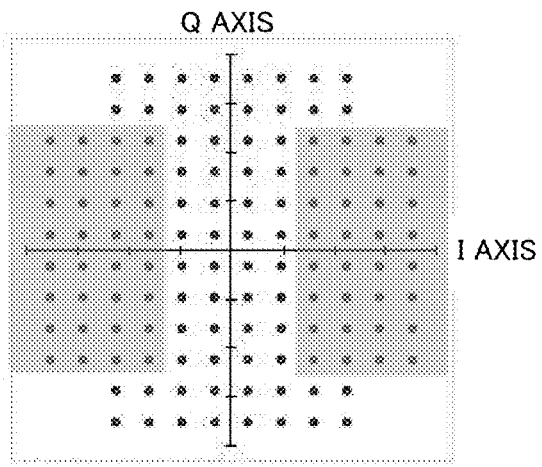
FIG. 9 is a diagram for illustrating a likelihood value in accordance with the coordinates of the reception signal point for an encoded bit 4 (b4) of the 128-QAM in the first embodiment of the present invention.

FIG. 7 is a diagram for illustrating a likelihood value in accordance with the coordinates of the reception signal point for the encoded bit 2 (b2) of the 128-QAM in the first embodiment of the present invention. FIG. 8 is a diagram for illustrating a likelihood value in accordance with the coordinates of the reception signal point for the encoded bit 3 (b3) of the 128-QAM in the first embodiment of the present invention. FIG. 9 is a diagram for illustrating a likelihood value in accordance with the coordinates of the reception signal point for the encoded bit 4 (b4) of the 128-QAM in the first embodiment of the present invention.

Figure 10:
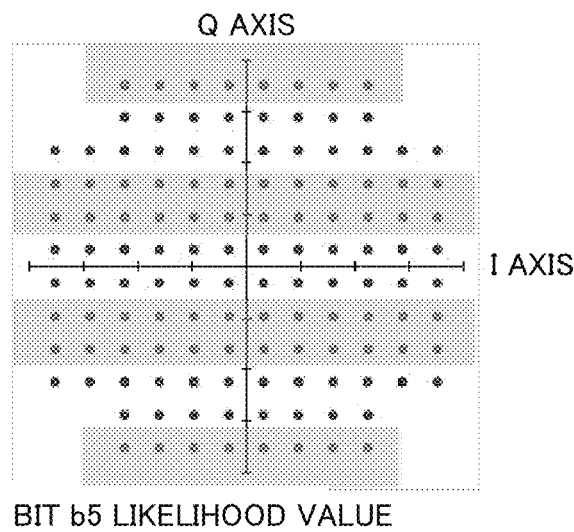
FIG. 10 is a diagram for illustrating a likelihood value in accordance with the coordinates of the reception signal point for an encoded bit 5 (b5) of the 128-QAM in the first embodiment of the present invention.
Figure 11:
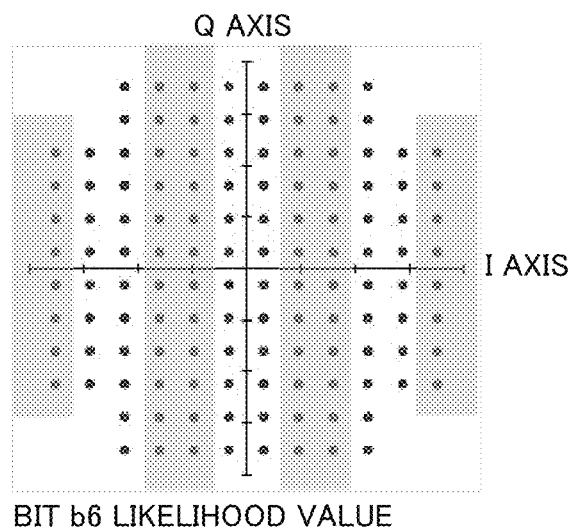
FIG. 11 is a diagram for illustrating a likelihood value in accordance with the coordinates of the reception signal point for an encoded bit 6 (b6) of the 128-QAM in the first embodiment of the present invention.

FIG. 10 is a diagram for illustrating a likelihood value in accordance with the coordinates of the reception signal point for the encoded bit 5 (b5) of the 128-QAM in the first embodiment of the present invention. Further, FIG. 11 is a diagram for illustrating a likelihood value in accordance with the coordinates of the reception signal point for the encoded bit 6 (b6) of the 128-QAM in the first embodiment of the present invention.

A hatched portion of the constellation corresponds to a region in which the likelihood value is positive. Those encoded bits are assigned to signal points such that the determination cannot be made based on only the information on the I axis or the information on the Q axis. For this reason, there is required processing by a two-dimensional modulation LUT that uses the coordinate information on the I axis and the Q axis to generate the likelihoods.

Figure 12:
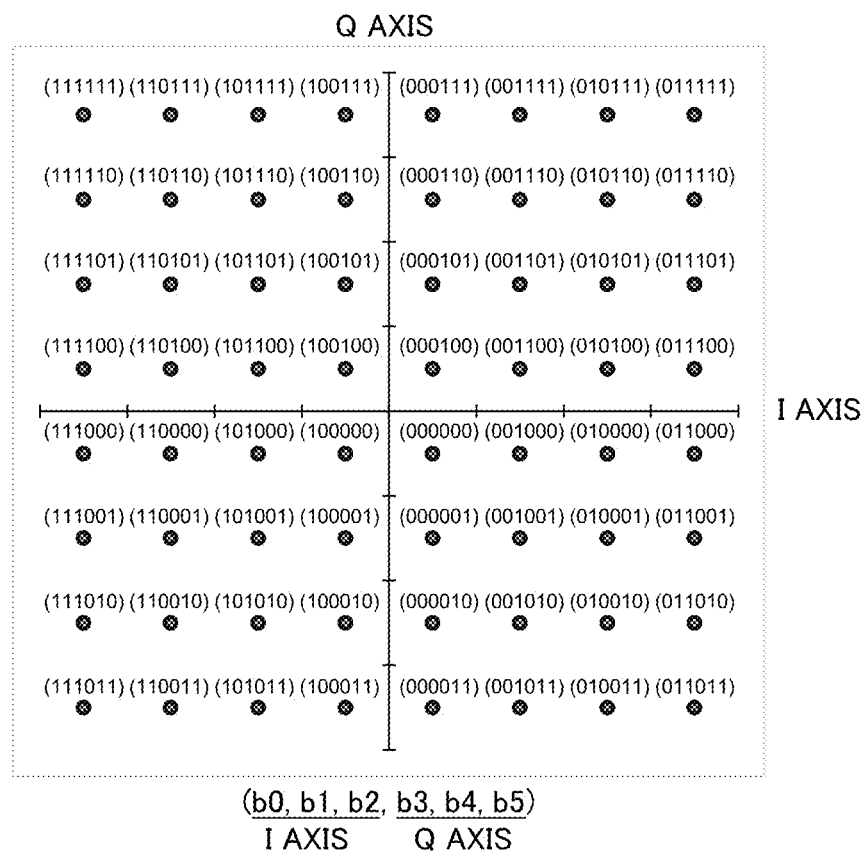
FIG. 12 is a constellation diagram for illustrating a relationship between signal points of 64-QAM and assigned bits in the first embodiment of the present invention.

FIG. 12 is a constellation diagram for illustrating a relationship between signal points of the 64-QAM and assigned bits in the first embodiment of the present invention. As illustrated in FIG. 12, the signal points of the 64-QAM form a rectangular constellation in which the signal points are arranged as a square on the phase plane.

Figure 13:
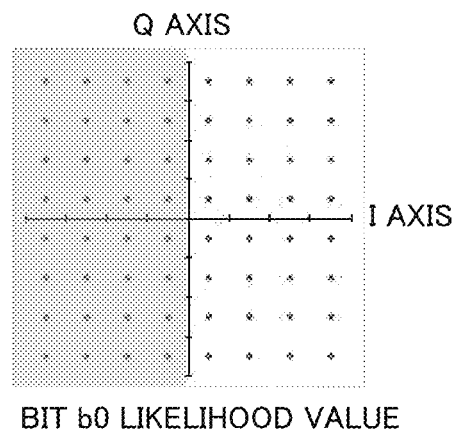
FIG. 13 is a diagram for illustrating a likelihood value in accordance with the coordinates of the reception signal point for an encoded bit b0 (b0) of the 64-QAM in the first embodiment of the present invention.
Figure 14:
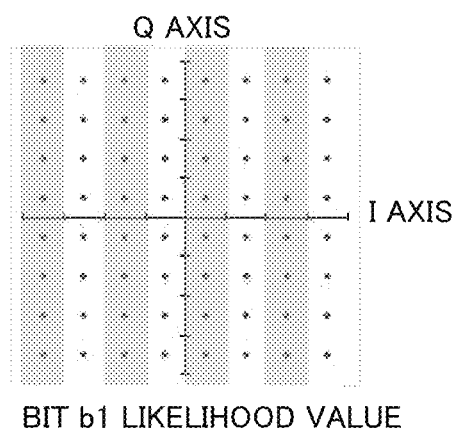
FIG. 14 is a diagram for illustrating a likelihood value in accordance with the coordinates of the reception signal point for an encoded bit b1 (b1) of the 64-QAM in the first embodiment of the present invention.
Figure 15:
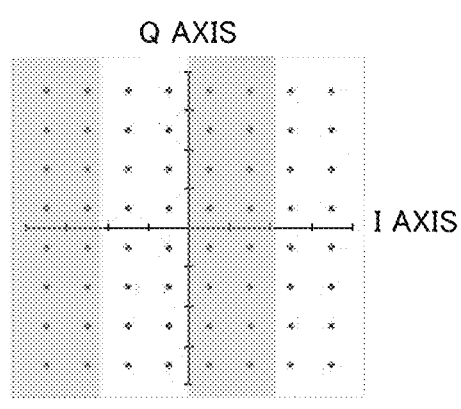
FIG. 15 is a diagram for illustrating a likelihood value in accordance with the coordinates of the reception signal point for an encoded bit b2 (b2) of the 64-QAM in the first embodiment of the present invention.

FIG. 13 is a diagram for illustrating a likelihood value in accordance with the coordinates of the reception signal point for the encoded bit 0 (b0) of the 64-QAM in the first embodiment of the present invention. FIG. 14 is a diagram for illustrating a likelihood value in accordance with the coordinates of the reception signal point for the encoded bit 1 (b1) of the 64-QAM in the first embodiment of the present invention. FIG. 15 is a diagram for illustrating a likelihood value in accordance with the coordinates of the reception signal point for the encoded bit 2 (b2) of the 64-QAM in the first embodiment of the present invention.

Figure 16:
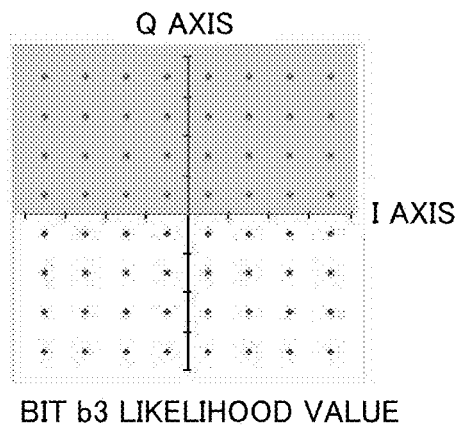
FIG. 16 is a diagram for illustrating a likelihood value in accordance with the coordinates of the reception signal point for an encoded bit b3 (b3) of the 64-QAM in the first embodiment of the present invention.
Figure 17:
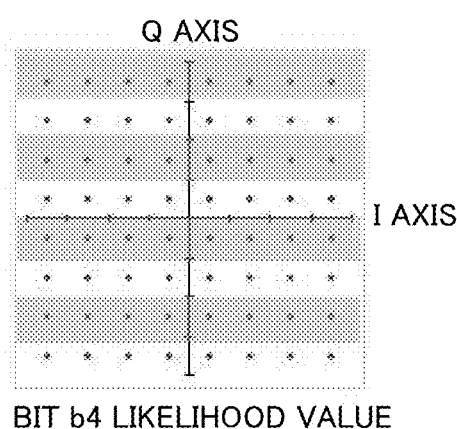
FIG. 17 is a diagram for illustrating a likelihood value in accordance with the coordinates of the reception signal point for an encoded bit b4 (b4) of the 64-QAM in the first embodiment of the present invention.
Figure 18:
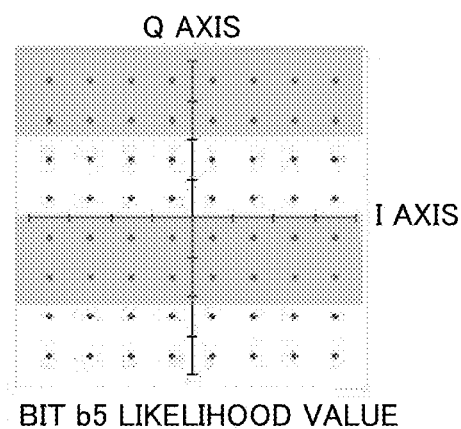
FIG. 18 is a diagram for illustrating a likelihood value in accordance with the coordinates of the reception signal point for an encoded bit b5 (b5) of the 64-QAM in the first embodiment of the present invention.

FIG. 16 is a diagram for illustrating a likelihood value in accordance with the coordinates of the reception signal point for the encoded bit 3 (b3) of the 64-QAM in the first embodiment of the present invention. FIG. 17 is a diagram for illustrating a likelihood value in accordance with the coordinates of the reception signal point for the encoded bit 4 (b4) of the 64-QAM in the first embodiment of the present invention. Further, FIG. 18 is a diagram for illustrating a likelihood value in accordance with the coordinates of the reception signal point for the encoded bit 5 (b5) of the 64-QAM in the first embodiment of the present invention.

The encoded bits b0 to b2 are assigned to only the I axis direction of the signal point, and can thus be processed by a one-dimensional modulation LUT that generates the likelihoods based on only coordinate information on one axis. Meanwhile, the encoded bits b3 to b5 are assigned to only the Q axis direction of the signal point, and can thus be processed by a one-dimensional modulation LUT that generates the likelihoods based on only coordinate information on one axis, as in the case of the encoded bits b0 to b2.

Figure 19:
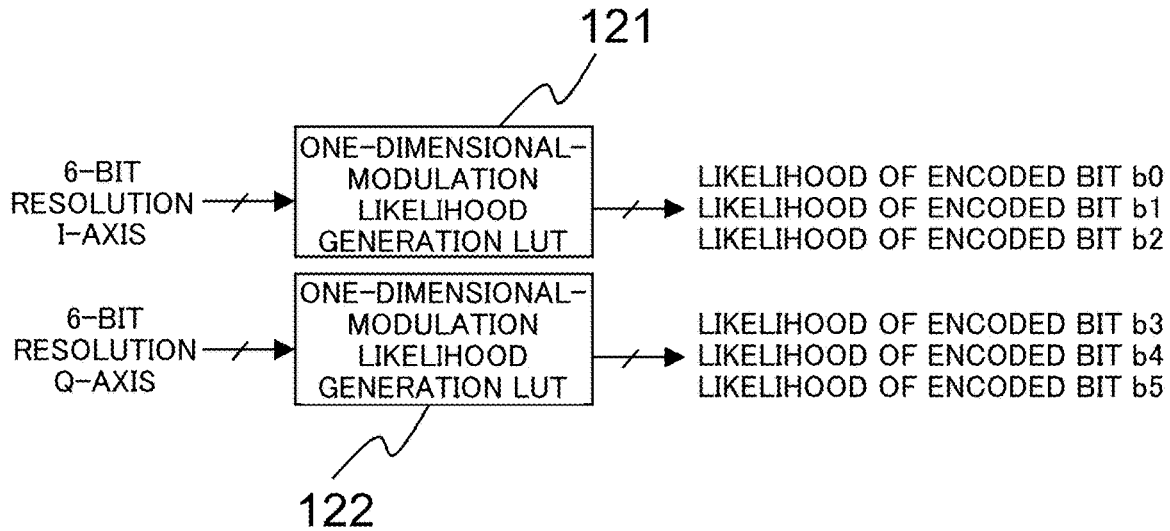
FIG. 19 is a configuration diagram of a 64-QAM likelihood generation LUT in the first embodiment of the present invention.

FIG. 19 is a configuration diagram of a 64-QAM likelihood generation LUT in the first embodiment of the present invention. An I axis component having a 6-bit resolution obtained from the coordinates of the reception signal point is input to a one-dimensional-modulation likelihood generation LUT 121. Meanwhile, a Q-axis component having the 6-bit resolution is input to a one-dimensional-modulation likelihood generation LUT 122.

After that, the one-dimensional-modulation likelihood generation LUT 121 generates likelihoods of the encoded bit 0 (b0), the encoded bit 1 (b1), and the encoded bit 2 (b2) based on the I-axis component having the 6-bit resolution. Meanwhile, the one-dimensional-modulation likelihood generation LUT 122 generates likelihoods of the encoded bit 3 (b3), the encoded bit 4 (b4), and the encoded bit 5 (b5) based on the Q-axis component having the 6-bit resolution.

Figure 20:
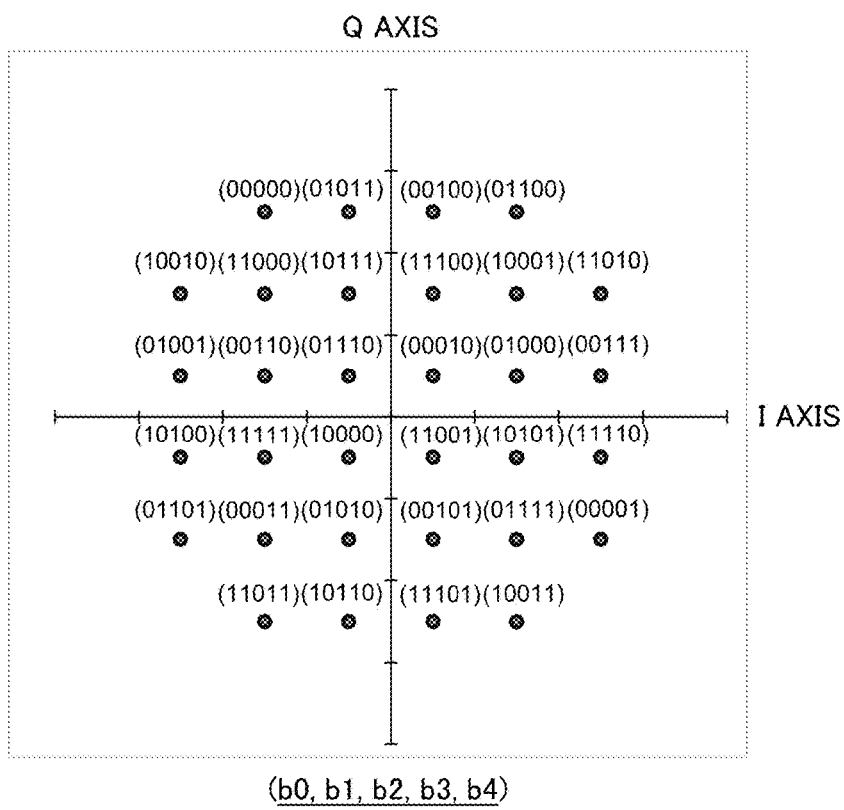
FIG. 20 is a constellation diagram for illustrating a relationship between signal points of 32-QAM and assigned bits in the first embodiment of the present invention.

FIG. 20 is a constellation diagram for illustrating a relationship between signal points of the 32-QAM and assigned bits in the first embodiment of the present invention. As illustrated in FIG. 20, the signal points of the 32-QAM form a non-rectangular constellation in which the signal points are not arranged as a square on the phase plane.

Figure 21:
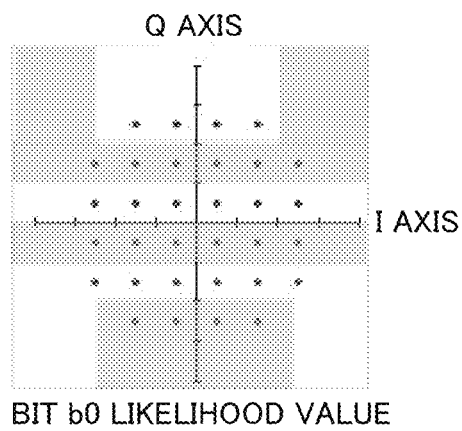
FIG. 21 is a diagram for illustrating a likelihood value in accordance with the coordinates of the reception signal point for an encoded bit b0 (b0) of the 32-QAM in the first embodiment of the present invention.
Figure 22:
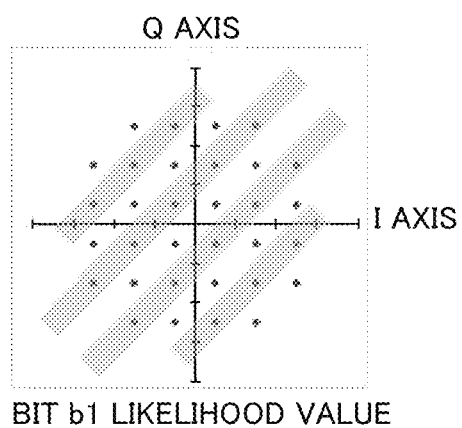
FIG. 22 is a diagram for illustrating a likelihood value in accordance with the coordinates of the reception signal point for an encoded bit b1 (b1) of the 32-QAM in the first embodiment of the present invention.
Figure 23:
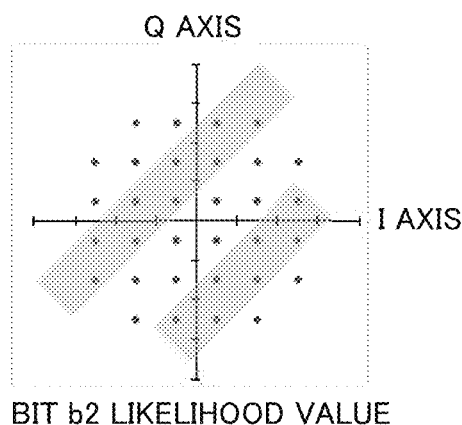
FIG. 23 is a diagram for illustrating a likelihood value in accordance with the coordinates of the reception signal point for an encoded bit b2 (b2) of the 32-QAM in the first embodiment of the present invention.

FIG. 21 is a diagram for illustrating a likelihood value in accordance with the coordinates of the reception signal point for the encoded bit 0 (b0) of the 32-QAM in the first embodiment of the present invention. FIG. 22 is a diagram for illustrating a likelihood value in accordance with the coordinates of the reception signal point for the encoded bit b1 (b1) of the 32-QAM in the first embodiment of the present invention. FIG. 23 is a diagram for illustrating a likelihood value in accordance with the coordinates of the reception signal point for the encoded bit b2 (b2) of the 32-QAM in the first embodiment of the present invention.

Figure 24:
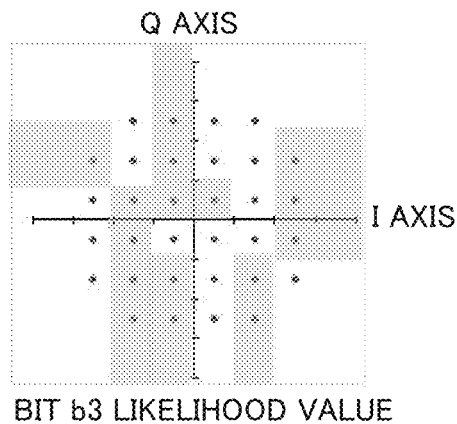
FIG. 24 is a diagram for illustrating a likelihood value in accordance with the coordinates of the reception signal point for an encoded bit b3 (b3) of the 32-QAM in the first embodiment of the present invention.
Figure 25:
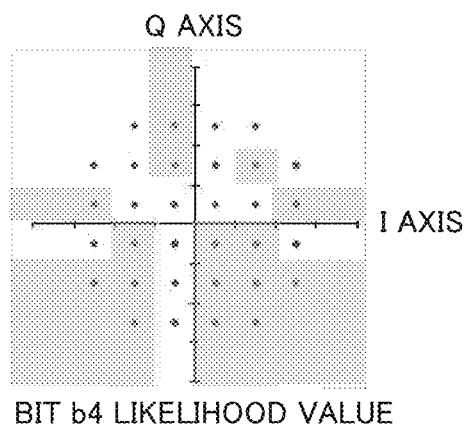
FIG. 25 is a diagram for illustrating a likelihood value in accordance with the coordinates of the reception signal point for an encoded bit b4 (b4) of the 32-QAM in the first embodiment of the present invention.

FIG. 24 is a diagram for illustrating a likelihood value in accordance with the coordinates of the reception signal point for the encoded bit b3 (b3) of the 32-QAM in the first embodiment of the present invention. Further, FIG. 25 is a diagram for illustrating a likelihood value in accordance with the coordinates of the reception signal point for the encoded bit b4 (b4) of the 32-QAM in the first embodiment of the present invention.

Hatched portions of FIG. 21 to FIG. 25 each indicate a region in which the likelihood value is positive. As illustrated in FIG. 21 to FIG. 25, the signal points exist such that the determination cannot be made based on only the information on the I axis or the information on the Q axis. For this reason, there is required processing by a two-dimensional modulation LUT that uses the coordinate information on the I axis and the Q axis to generate the likelihoods.

Figure 26:
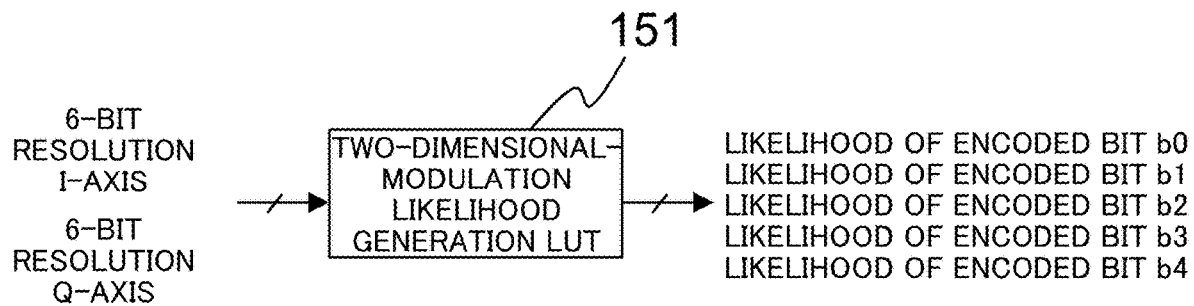
FIG. 26 is a configuration diagram of a 32-QAM likelihood generation LUT in the first embodiment of the present invention.

FIG. 26 is a configuration diagram of a 32-QAM likelihood generation LUT in the first embodiment of the present invention. A signal being a concatenation of an I-axis component and a Q-axis component, each of which has a 6-bit resolution, and is obtained from coordinates of the reception signal point, is input to a two-dimensional-modulation likelihood generation LUT 151. After that, the two-dimensional-modulation likelihood generation LUT 151 generates likelihoods of the encoded bit 0 (b0), the encoded bit 1 (b1), the encoded bit 2 (b2), the encoded bit 3 (b3), and the encoded bit 4 (b4) based on the signal being the concatenation of the I-axis component and the Q-axis component each having the 6-bit resolution.

The 32-QAM likelihood generation LUT and the 64-QAM likelihood generation LUTs have the same configurations as those of the one-dimensional-modulation likelihood generation LUT forming the 128-QAM likelihood generation circuit and the two-dimensional-modulation likelihood generation LUTs forming the 128-QAM likelihood generation circuit, respectively. Consequently, the 32-QAM likelihood generation circuit and the 64-QAM likelihood generation circuit can be shared so as to be used as the 128-QAM likelihood generation circuit.

In other words, in the first embodiment, a high-order non-rectangular QAM is formed of one-dimensional-modulation likelihood generation circuits and a two-dimensional-modulation likelihood generation circuit. With this configuration, likelihood generation circuits used for a low-order non-rectangular QAM and a low-order rectangular QAM can be shared to be used as a likelihood generation circuit used for a high-order non-rectangular QAM. As a result, there is achieved a likelihood generation circuit capable of suppressing an increase in circuit scale for the likelihood generation through use of LUTs. Such a likelihood generation circuit can be applied to an optical transmission device that employs a non-rectangular high-order modulation method equal to or higher than 8-QAM.

Figure 27:
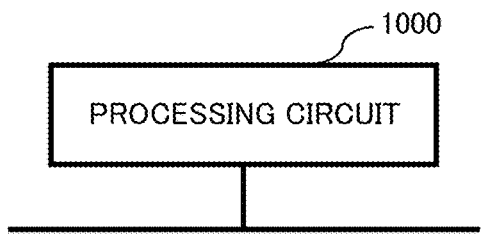
FIG. 27 is a configuration diagram for illustrating a case in which each function of an optical transmission device according to the first embodiment of the present invention is implemented by a processing circuit being dedicated hardware.
Figure 28:
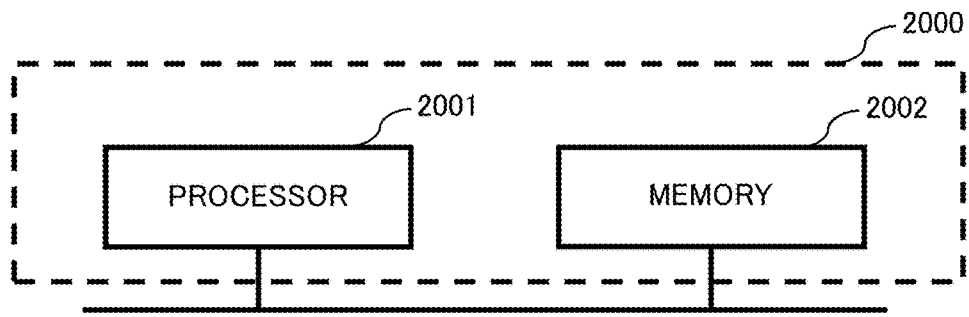
FIG. 28 is a configuration diagram for illustrating a case in which each function of the optical transmission device according to the first embodiment of the present invention is implemented by a processing circuit that includes a processor and a memory.

Each function of the optical transmission device according to the first embodiment described above is implemented by a processing circuit. The processing circuit for implementing each function may be dedicated hardware, or a processor configured to execute a program stored in a memory. FIG. 27 is a configuration diagram for illustrating a case in which each function of the optical transmission device according to the first embodiment of the present invention is implemented by a processing circuit 1000 being dedicated hardware. Moreover, FIG. 28 is a configuration diagram for illustrating a case in which each function of the optical transmission device according to the first embodiment of the present invention is implemented by a processing circuit 2000 that includes a processor 2001 and a memory 2002.

When the processing circuit is dedicated hardware, the processing circuit 1000 corresponds to, for example, a single circuit, a composite circuit, a programmed processor, a parallel-programmed processor, an application specific integrated circuit (ASIC), a field programmable gate array (FPGA), or a combination thereof. The functions of the respective units of the symbol demapping unit, the likelihood generation circuit, and the error correction decoding unit forming the optical transmission device may be implemented by individual processing circuits 1000, or may altogether by implemented by the processing circuit 1000.

Meanwhile, when the processing circuit is the processor 2001, the functions of the respective units of the symbol demapping unit, the likelihood generation circuit, and the error correction decoding unit are implemented by software, firmware, or a combination of software and firmware. The software and the firmware are coded as a program and stored in the memory 2002.

The processor 2001 reads out and executes the program stored in the memory 2002, to thereby implement the function of each of the units. That is, the optical transmission device includes the memory 2002 configured to store programs the execution of which by the processing circuit 2000 ultimately leads to the implementation of each processing step.

It is also understood that those programs cause a computer to execute the steps and methods described above for the respective units. In this case, the memory 2002 corresponds to, for example, a random access memory (RAM), a read only memory (ROM), a flash memory, an erasable programmable read only memory (EPROM), an electrically erasable and programmable read only memory (EEPROM), or other such non-volatile or volatile semiconductor memory. The memory 2002 also corresponds to, for example, a magnetic disk, a flexible disk, an optical disc, a compact disc, a MiniDisk, or a DVD.

Some of the functions of the respective units described above may be implemented by dedicated hardware, and others thereof may be implemented by software or firmware.

In this manner, the processing circuit can implement the function of each of the units described above by hardware, software, firmware, or a combination thereof.

REFERENCE SIGNS LIST 11 error correction encoding unit, 12 symbol mapping unit, 13 transmission line channel, 14 symbol demapping unit, 15 one-dimensional-modulation likelihood generation LUT for I-axis component, 16 one-dimensional-modulation likelihood generation LUT for Q-axis component, 17 two-dimensional-modulation likelihood generation LUT, 18 error correction decoding unit, 121 one-dimensional-modulation likelihood generation LUT for I-axis component, 122 one-dimensional-modulation likelihood generation LUT for Q-axis component, 151 two-dimensional-modulation likelihood generation LUT

The invention claimed is:

1. An optical reception device, comprising:
a symbol demapping circuitry to convert reception signals, which are acquired via transmission over an optical transmission line, said reception signals being selectively modulated for transmission according to
low-order rectangular QAM,
low-order non-rectangular QAM, and
high-order non-rectangular QAM,
to a signal of an I-axis component and a signal of a Q-axis component on a phase plane, and a signal being a concatenation of the signal of the I-axis component and the signal of the Q-axis component;
a likelihood generating circuitry to generate likelihoods relating to each of the reception signals based on the corresponding signal of the I-axis component and the corresponding signal of the Q-axis component converted by the symbol demapping circuitry and on the signal being the concatenation of the signal of the I-axis component and the signal of the Q-axis component; and
an error correction decoding circuitry to execute soft decision decoding on each of the reception signals based on the likelihoods generated by the likelihood generating circuitry,
wherein the likelihood generating circuitry includes:
a first one-dimensional-modulation lookup table configured to input the signal of the I-axis component of each of the reception signals as an argument to output a first likelihood;
a second one-dimensional-modulation lookup table configured to input the signal of the Q-axis component of each of the reception signals as an argument to output a second likelihood; and
a two-dimensional-modulation lookup table configured to input, as an argument, the signal being the concatenation of the signal of the I-axis component and the signal of the Q-axis component of each of the reception signals, to generate a third likelihood, and
wherein the error correction decoding circuitry is configured to execute the soft decision decoding based on the first likelihood, the second likelihood, and the third likelihood,
wherein the first one-dimensional-modulation lookup table and the second one-dimensional-modulation lookup table are used for the likelihood generation for each of the reception signals modulated according to the low-order rectangular QAM, wherein the two-dimensional-modulation lookup table is used for the likelihood generation for each of the reception signals modulated according to the low-order non-rectangular QAM, and wherein the first one-dimensional-modulation lookup table, the second one-dimensional-modulation lookup table, and the two-dimensional-modulation lookup table are shared to be used for the likelihood generation for each of the reception signals modulated according to the high-order non-rectangular QAM.

2. An error correction decoding apparatus for executing soft decision decoding on signals converted from reception signals as a result of symbol demapping, the reception signals being acquired via transmission over an optical transmission line, said reception signals being selectively modulated for transmission according to low-order rectangular QAM,
low-order non-rectangular QAM, and
high-order non-rectangular QAM, the converted signals from each of the reception signals including a signal of an I-axis component and a Q-axis component reception signal on a phase plane, and a signal being a concatenation of the signal of the I-axis component and the signal of the Q-axis component, the error correction decoding apparatus comprising:

a first one-dimensional-modulation lookup table configured to input, as an argument, the signal of an I-axis component out of signals obtained by converting a respective one of the reception signals to the signals on a phase plane, to output a first likelihood;

a second one-dimensional-modulation lookup table configured to input, as an argument, the signal of a q-axis component out of the signals obtained by converting the respective one of the reception signals to the signals on the phase plane, to output a second likelihood; and a two-dimensional-modulation lookup table configured to input, as an argument, the signal being the concatenation of the signal of the I-axis component and the signal of the Q-axis component, to generate a third likelihood, the signal of the I-axis component and the signal of the Q-axis component being the signals obtained by converting the reception signal to the signals on the phase plane, wherein the first one-dimensional-modulation lookup table and the second one-dimensional-modulation lookup table are used for the likelihood generation for each of the reception signals demodulated according to the low-order rectangular QAM, wherein the two-dimensional-modulation lookup table is used for the likelihood generation for each of the reception signals demodulated according to the low-order non-rectangular QAM, and wherein the first one-dimensional-modulation lookup table, the second one-dimensional-modulation lookup table, and the two-dimensional-modulation lookup table are shared to be used for the likelihood generation for each of the reception signals demodulated according to the high-order non-rectangular QAM.

* * * * *